US009658655B2

(12) United States Patent
Yu

(10) Patent No.: US 9,658,655 B2
(45) Date of Patent: May 23, 2017

(54) ELECTRONIC APPARATUS AND COVER STRUCTURE THEREOF

(71) Applicant: Wistron Corporation, New Taipei (TW)

(72) Inventor: Ching-Jen Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 115 days.

(21) Appl. No.: 14/299,741

(22) Filed: Jun. 9, 2014

(65) Prior Publication Data

US 2015/0062796 A1    Mar. 5, 2015

(30) Foreign Application Priority Data

Aug. 27, 2013    (TW) .............................. 102130708 A

(51) Int. Cl.
   *G06F 1/18*    (2006.01)
   *H05K 7/14*    (2006.01)
   *H05K 5/02*    (2006.01)
   *G11B 33/02*   (2006.01)

(52) U.S. Cl.
   CPC ............ *G06F 1/181* (2013.01); *G11B 33/027* (2013.01); *H05K 5/023* (2013.01); *H05K 5/0221* (2013.01); *H05K 5/0239* (2013.01); *H05K 7/1488* (2013.01); *H05K 7/1489* (2013.01)

(58) Field of Classification Search
   CPC ..... G06F 1/181; H05K 7/1488; H05K 5/0221
   USPC .................. 361/685, 679.02, 679.57, 679.37
   See application file for complete search history.

(56) References Cited

U.S. PATENT DOCUMENTS

| 7,480,137 B1* | 1/2009 | Jyh | ...................... E05B 73/0082 165/104.33 |
| 2004/0228083 A1* | 11/2004 | Wang | ................... H05K 5/0239 361/679.02 |
| 2011/0139735 A1* | 6/2011 | Li | ........................ G11B 33/124 211/26.2 |

OTHER PUBLICATIONS

Office Action mailed Nov. 4, 2016 in corresponding Chinese Patent Application No. 201310428342.9.

* cited by examiner

*Primary Examiner* — Tuan T Dinh
*Assistant Examiner* — Rockshana Chowdhury
(74) *Attorney, Agent, or Firm* — Muncy, Geissler, Olds & Lowe, P.C.

(57) ABSTRACT

A cover structure for an electronic apparatus is disclosed. The cover structure includes a bezel, a first bracket and a first handle. The bezel includes two long sides, a first lateral side and a second lateral side. The first bracket is fixed on the first lateral side and includes a first protruding portion. The first handle moveably combines with the bezel, and the first handle is moved substantially parallel to each long side of the bezel. The first handle includes a first recess and at least one first fixed portion, and the first protruding portion is disposed in the first recess. The at least one first fixed portion is used for combining with a housing of the electronic apparatus.

18 Claims, 6 Drawing Sheets

ELECTRONIC APPARATUS AND COVER STRUCTURE THEREOF

FIELD OF THE INVENTION

The exemplary embodiment of the present invention relates to a cover structure. More specifically, the exemplary embodiment of the present invention relates to a cover structure that is configured for protecting the panel of the electronic apparatus from being touched inadvertently. The present invention further comprises an electronic apparatus adopting the cover structure.

BACKGROUND OF THE RELATED ART

For facilitating the operation of an electronic apparatus by users, the function buttons or the components to be operated are collected on one side of the electronic apparatus. This collection of function buttons or components forms an operation panel of an electronic apparatus such as a desktop computer, a server, or a media player. In a server, for example, the central portion of the operation panel is provided for installing or uninstalling a storage apparatus such as a hard disk. The function buttons located on two sides of the operation panel can facilitate the user changing the storage apparatus or executing each operation via the function buttons. Because a server frequently needs provide access to huge amounts of data, the server must be kept in a stable operating state; however, the operation panels are mostly exposed to the outside and not protected, and if the user touches the function buttons inadvertently or someone damages the function buttons intentionally, the server may be restarted due to the unstable state or the data stored in the server may be damaged.

Therefore, there is a need to design a cover structure that has a function of protecting the panel of the electronic apparatus and that can easily be detached when the user needs to disassemble the cover structure.

SUMMARY OF THE INVENTION

The main object of the present invention is to provide a cover structure that is configured for protecting the panel of the electronic apparatus from being touched inadvertently.

In order to achieve the aforementioned object, the cover structure comprises a bezel, a first bracket, and a first handle. The bezel comprises two long sides, a first lateral side and a second lateral side; the first bracket, fixed on the first lateral side, comprises a first protruding portion; the first handle is moveably combined with the first lateral side, and the first handle is able to substantially move parallel to each long side of the bezel; the first handle comprises a first recess and at least one first fixed portion; the first protruding portion of the first bracket is disposed in the first recess, and the at least one first fixed portion is configured for connecting a casing of the electronic apparatus.

The present invention further comprises an electronic apparatus adopting the above cover structure, and the electronic apparatus comprises a casing and the above cover structure being detachable from the casing.

By this design, the cover structure of the present invention can protect the operation panel disposed on the casing of the electronic apparatus from being touched inadvertently by the user, and the cover structure of the present invention is easily to install and uninstall, so the convenience for the user is further increased.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

For facilitating understanding and clarifying the object, characteristics, and advantages of the present invention, the following specific embodiments and figures illustrating the present invention are presented as a detailed description.

Figure 1:
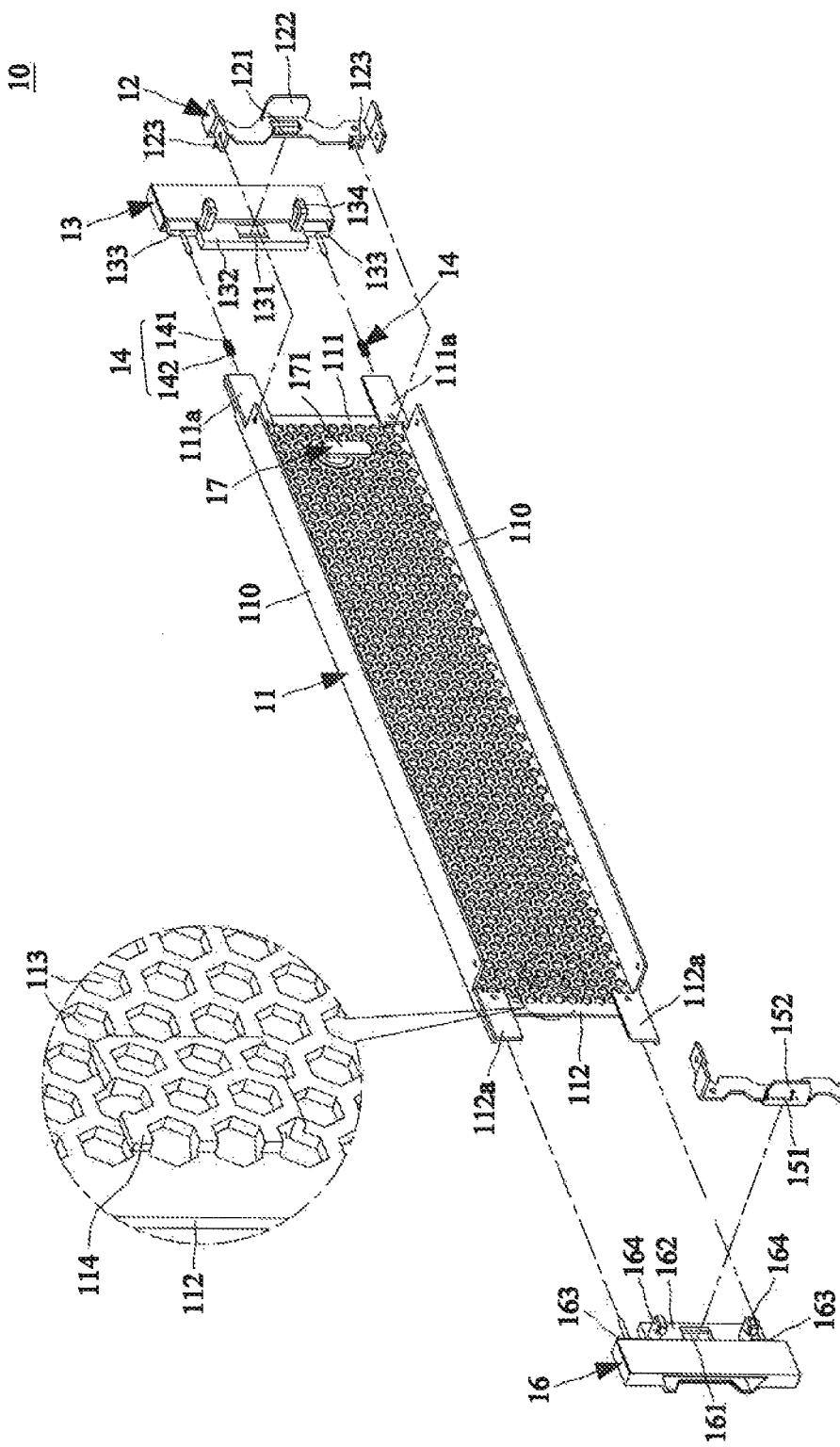
FIG. 1 is an exploded diagram of the cover structure in accordance with the present invention.
Figure 2:
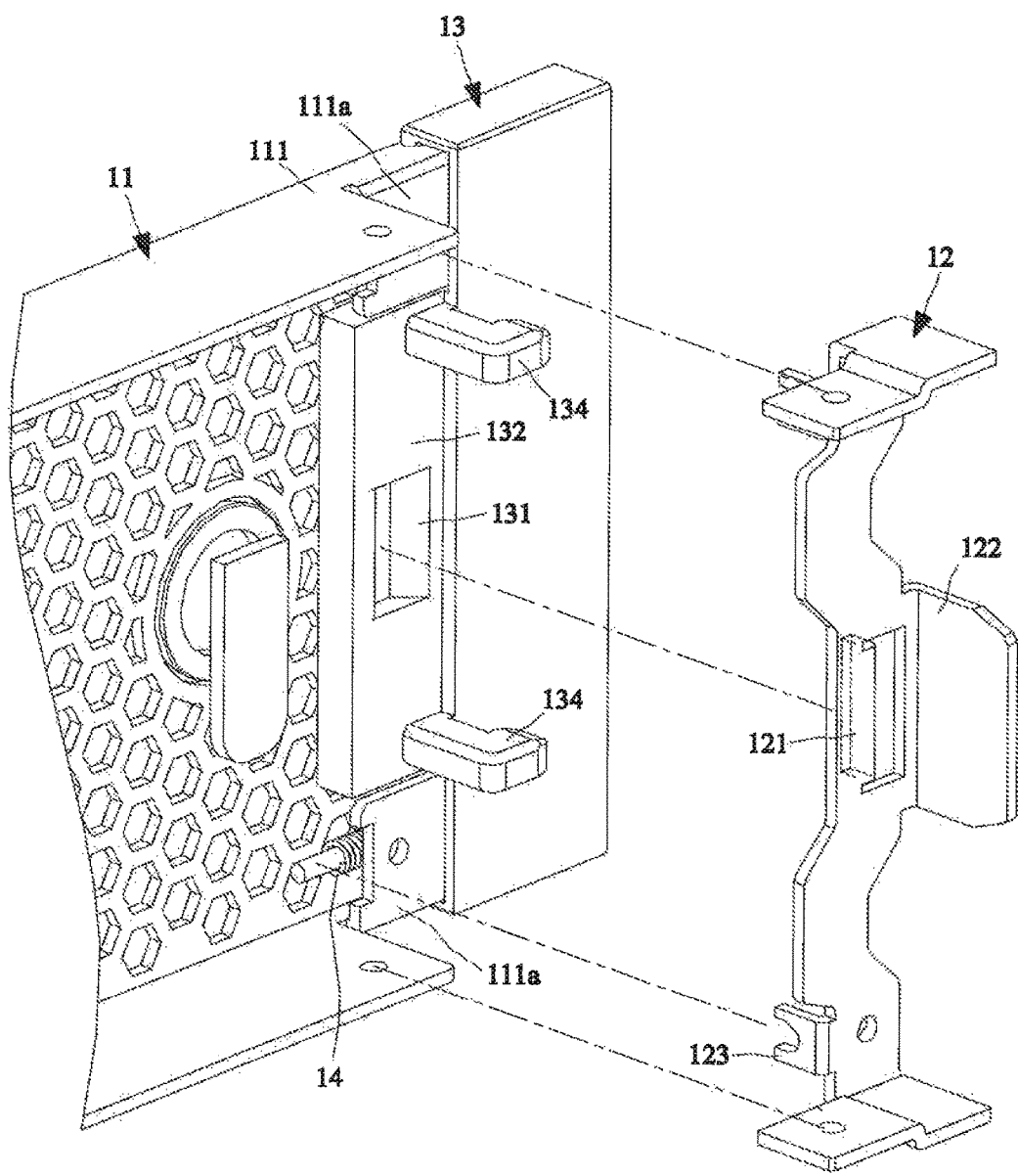
FIG. 2 is a portion combining schematic diagram of the cover structure in accordance with the present invention.

Please refer to FIG. 1 and FIG. 2. FIG. 1 is an exploded diagram of the cover structure in accordance with the present invention; FIG. 2 is a portion combining schematic diagram of the cover structure in accordance with the present invention. The cover structure 10 of the present invention can be applied to an electronic apparatus such as a desktop computer, a server, or a media player (a CD-ROM player, for example), but the present invention is not limited thereto; the cover structure can also be applied to another electronic apparatus having a similar front operation panel.

As shown in FIG. 1 and FIG. 2, the cover structure 10 of the present invention comprises a bezel 11, a first bracket 12, and a first handle 13. The bezel 11 is a rectangular sheet; the bezel 11 comprises two long sides 110, a first lateral side 111, and a second lateral side 112 facing each other, and the bezel 11 forms two first guiding portions 111a on the first lateral side 111. In one embodiment of the present invention, each of the first guiding portions 111a is similar to a guide slot structure formed by bending the bezel 11. However, by different design, each of the first guiding portions 111a may also form a solid bump, and the invention is not limited by the above embodiments. In the bezel 11 is further disposed a plurality of punctures 113; thus, when the bezel 11 is connected to the electronic apparatus, the plurality of punctures 113 can be used as heat dissipating holes and thus improve the heat dissipating effect of the electronic apparatus.

The first bracket 12 is fixed on the first lateral side 111 of the bezel 11, and thus an interval is formed between the bezel 11 and the first bracket 12 for passing through part of the first handle 13. In one embodiment of the present invention, locking holes are disposed on the suitable corresponding positions of the first bracket 12 and the bezel 11, and the locking members such as screws or bolts can be disposed in the locking holes for fixing the first bracket 12 on the bezel 11, but the fixing ways are not limited thereto.

In addition, in another embodiment of the present invention, the first bracket 12 and the bezel 11 can be formed integrally so as to reduce the number of members that need to be installed between the first bracket 12 and the bezel 11 and the use of the locking member.

The first bracket 12 comprises a first protruding portion 121 (the dot line portion shown in the figure) and a first position-limiting portion 122. The first protruding portion 121 and the first position-limiting portion 122 are all substantially perpendicular to the bezel 11, and the first protruding portion 121 and the first position-limiting portion 122 extend along reverse directions. For example, in the present embodiment, the first protruding portion 121 extends along the direction toward the bezel 11, and the first position-limiting portion 122 extends along the direction away from the bezel 11.

In addition, the first bracket 12 further comprises at least one first stopping portion 123. Each of the first stopping portions 123 is also perpendicular to the bezel 11 and extends along the direction toward the bezel 11, and each of the first stopping portions 123 is disposed at a position corresponding to the first guiding portion 111a. It has to be noted here that each of the first stopping portions 123 can be replaced by a bending structure formed at each of the first guiding portions 111a, but the invention is not to be limited by the present embodiment.

By the first bracket 12, the first handle 13 can be movably combined with the first lateral side 111 and move substantially parallel to the long side 110 of the bezel 11. The first handle 13 comprises a first recess 131, a first extension portion 132, two first corresponding guiding portions 133, and at least one first fixed portion 134. The first recess 131 is provided for accommodating the first protruding portion 121 of the first bracket 12; when the first handle 13 is combined with the first lateral side 111 of the bezel 11, the first bracket 12 is further fixed on the bezel 11 and thus allows the first protruding portion 121 to plug into the first recess 131 so as to restrict the movement of the first handle 13 relative to the bezel 11 by the first protruding portion 121. When the first handle 13 is combined with the first lateral side 111, the first extension portion 132 is located in the space formed between the first bracket 12 and the bezel 11.

Each of the first corresponding guiding portions 133 is disposed correspondingly to each of the first guiding portions 111a of the bezel 11, and the structures and the positions are corresponding to each other so as to assist the first handle 13 in moving stably relative to the bezel 11. In one embodiment of the present invention, each of the first corresponding guiding portions 133 forms a guiding bump for corresponding to the above first guiding portion 111a having the guiding trough type; if the first guiding portion 111a is a solid bump, here the first corresponding guiding portion 133 can also form a corresponding guiding trough.

The at least one first fixed portion 134 provides a fixing function when the cover structure 10 of the present invention is combined with the casing of the electronic apparatus. Here, the first fixed portion 134 is a hook structure, but the structure type can be changed depending on the corresponding fixing structure disposed on the casing of the electronic apparatus, such as a fixing trough. In addition, the number and the locations of the at least one first fixed portion 134 correspond to the number and the locations of the corresponding at least one fixing structure disposed on the casing of the electronic apparatus.

The cover structure 10 of the present invention further comprises at least one elastic member 14. Each of the elastic members 14 is configured for providing a position-returning function after the first handle 13 moves relative to the bezel 11. Each of the elastic members 14 can be disposed in each of the first guiding portions 111a of the bezel 11, and comprises a first end 141 and a second end 142. The first end 14 is against the first corresponding guiding portion 133 of the first handle 133, and the second end 142 is against the first stopping portion 123 of the first bracket 12. It has to be noted here that if the first stopping portion 123 of the first bracket 12 has been replaced by the above bending structure formed from the first guiding portion 111a of the bezel 11, then the second end 142 of the elastic member 14 will be against the guiding portion 111a of the bezel 11, but the present invention is not limited thereto.

The cover structure 10 of the present invention further comprises a second bracket 15 and a second handle 16. The second bracket 15 is fixed on the second lateral side 112 of the bezel 11, and thus a space is formed between the bezel 11 and the second bracket 15 for passing through part of the second handle 16. In one embodiment of the present invention, locking holes are disposed on the suitable corresponding positions of the second bracket 15 and the bezel 11, and the locking members such as screws or bolts can be disposed in the locking holes for fixing the second bracket 15 to the bezel 11, but the fixing ways are not limited thereto. In addition, in another embodiment of the present invention, the second bracket 15 and the bezel 11 can be formed integrally.

The second bracket 15 comprises a second protruding portion 151 and a second position-limiting portion 152. The second protruding portion 151 and the second position-limiting portion 152 are all substantially perpendicular to the bezel 11, and the second protruding portion 151 and the second position-limiting portion 152 extend along reverse directions. For example, in the present embodiment, the second protruding portion 151 extends along the direction toward the bezel 11, and the second position-limiting portion 152 extends along the direction away from the bezel 11.

The first handle 13 and the second handle 16 are members having the same structure. The second handle 16 is combined with the second lateral side 112 by the second bracket 15. In order to match with the disposition of the second handle 16, the bezel 11 forms two second guiding portions 112a at the second lateral side 112. In one embodiment of the present invention, each of the second guiding portions 112a is a guiding trough-like structure formed by bending the sheet member of the bezel 11, but the present invention is not limited thereto.

The second handle 16 comprises a second recess 161, a second extension portion 162, two second corresponding guiding portions 163, and at least one second fixed portion 164. The second recess 161 is provided for accommodating the second protruding portion 151 of the second bracket 15; when the second handle 16 is combined with the second lateral side 112 of the bezel 11, the second bracket 15 is further fixed on the bezel 11 and thus the second protruding portion 151 can plug into the second recess 161. When the second handle 16 is combined with the second lateral side 112, the second extension portion 162 is located in the space formed between the second bracket 15 and the bezel 11.

Each of the second corresponding guiding portions 163 is disposed correspondingly to each of the second guiding portions 112a of the bezel 11, and the structures and the positions are corresponding to each other so as to assist the second handle 16 in being disposed stably. In one embodiment of the present invention, each of the second corresponding guiding portions 163 forms a guiding bump for corresponding with the above second guiding portion 112a having the guiding trough type; if the second guiding portion 112a is a solid bump, here the second corresponding guiding portion 163 can also form a corresponding guiding trough.

The at least one second fixed portion 164 provides a fixing function when the cover structure 10 of the present invention is combined with the casing of the electronic apparatus. Here, the second fixed portion 164 is a hook structure, but the structure type can be changed depending on the corresponding fixing structure disposed on the casing of the electronic apparatus, for example a fixing trough. In addition, the number and the disposing locations of the second fixed portion 164 correspond to the number and the disposing locations of the corresponding fixing structures disposed on the casing of the electronic apparatus.

As shown in FIG. 1, in one embodiment of the present invention, the second lateral side 112 of the bezel 11 further comprises a resistance portion 114. The resistance portion 114 is convex from the bezel 11, and the disposing position of the resistance portion 114 corresponds to the second extension portion 162 of the second handle 16. By this disposal of the resistance portion 114, when the second handle 16 is combined with the second lateral side 112 of the bezel 11, the resistance portion 114 can directly be against the second extension portion 162 of the second handle 16 so as to stop the second handle 16 moving relative to the bezel 11. That is to say, due to the disposition of the resistance portion 114, the second handle 16 cannot move relative to the bezel 11, unlike the first handle 13.

The cover structure 10 of the present invention further comprises a locking module 17. The locking module 17 is disposed on the bezel 11, and the locking module 17 is disposed near the first lateral side 111. In one embodiment of the present invention, the locking module 17 comprises a locking member 171 that is able to rotate relative to the bezel 11. When the locking member 171 is rotated to a position facing the first handle 13, the locking module 17 is in a locked state, and at this time the locking member 171 can be against the first handle 13 so as to stop the first handle 13 from moving relative to the bezel 11.

Figure 3:
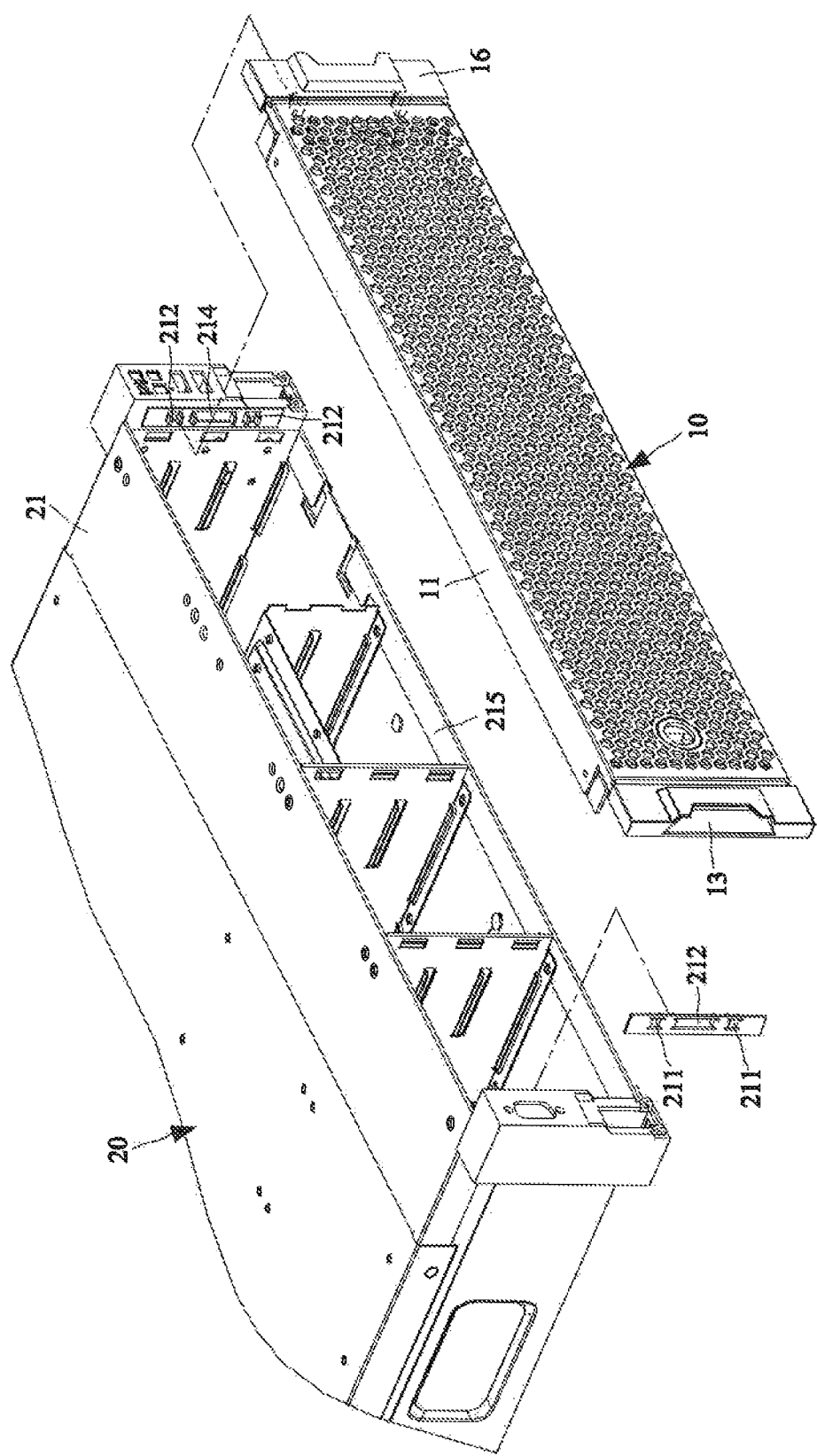
FIG. 3 is a schematic diagram of the cover structure applied to an electronic apparatus in accordance with the present invention.

Please refer to FIG. 3, which is a schematic diagram of the cover structure adopted in the electronic apparatus in accordance with the present invention. As shown in FIG. 1 to FIG. 3, in order to let the electronic apparatus 20 be combined with the cover structure 10 of the present invention, at least one first corresponding fixing portion 211 and at least one second corresponding fixing portion 212 are disposed on the casing 21 of the electronic apparatus 20. Each of the first corresponding fixing portions 211 corresponds to each of the first fixed portions 134 of the first handle 13, and each of the second corresponding fixing portions 212 corresponds to each of the second fixed portions 164 of the second handle 16. In one embodiment of the present invention, each of the first corresponding fixing portions 211 and the second corresponding fixing portions 212 all correspond to the engaging hole of the abovementioned hook structure, but the present invention is not limited thereto. In addition, a first corresponding position-limiting portion 213 and a second corresponding position-limiting portion 214 are disposed correspondingly on the casing 21. The first corresponding position-limiting portion 213 corresponds to the first position-limiting portion 122 of the first bracket 12, and the second corresponding position-limiting portion 214 corresponds to the second position-limiting portion 152 of the second bracket 15. In one embodiment of the present invention, each of the first corresponding fixing portions 211 and each of the second corresponding fixing portions 212 is a pair of stopping sheets, and the space between the stopping sheets can accommodate the corresponding position-limiting portion, but the present invention is not limited thereto.

In the present embodiment, the disposing position of the first handle 13 corresponds to the corresponding position of the casing 21 provided for disposing a function button module, and the disposing position of the second handle 16 corresponds to the corresponding position of the casing 21 provided for disposing another function button module. Therefore, when the cover structure 10 is combined with the electronic apparatus 20, each of the function button modules located on the front side 215 of the casing 21 is shielded by the cover structure 10, and thus the effect of preventing the function button from being touched inadvertently is achieved.

Figure 4:
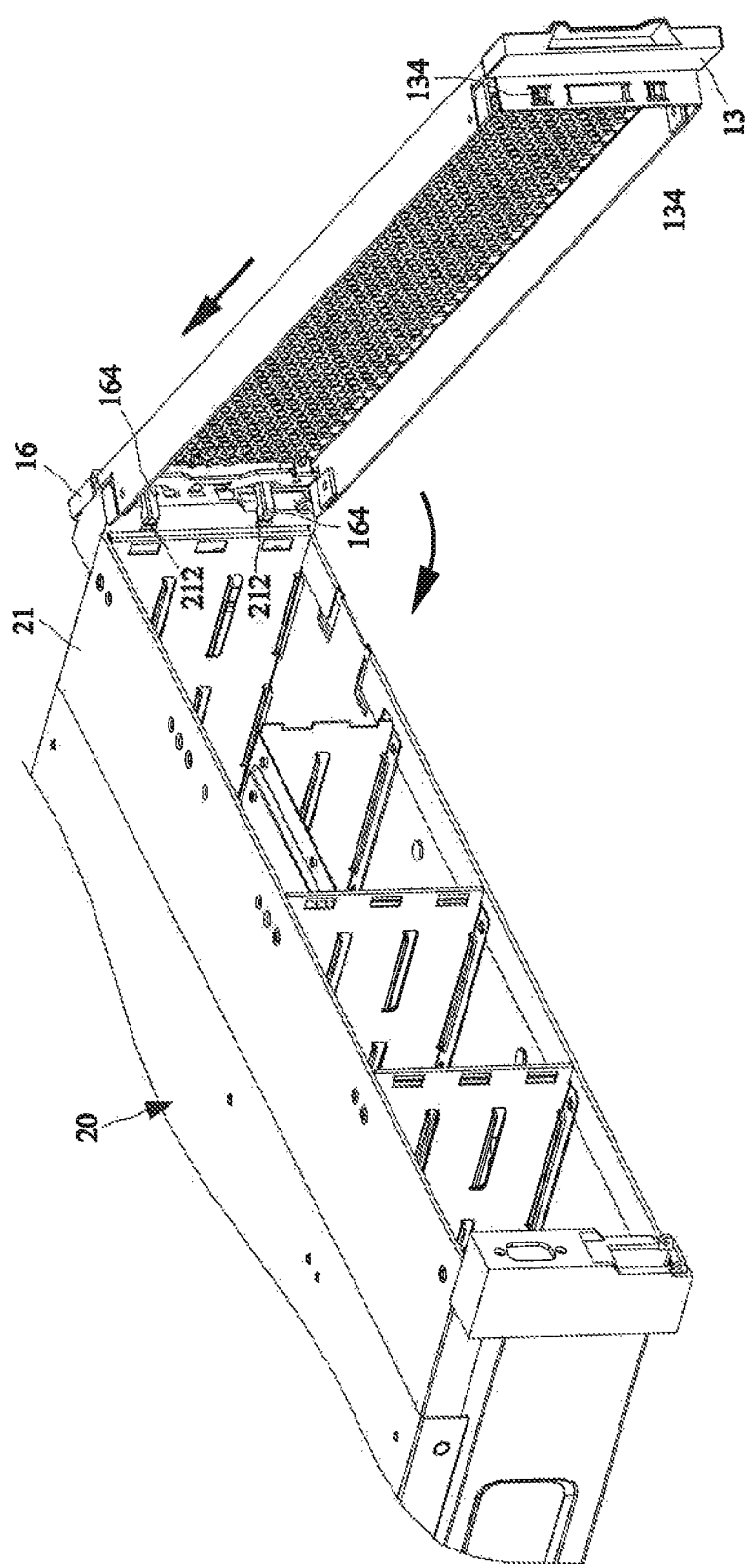
FIG. 4 is a schematic diagram of the cover structure being combined with the casing of the electronic apparatus in accordance with the present invention.

Please refer to FIG. 4, which is a schematic diagram of the cover structure being combined with the casing of the electronic apparatus in accordance with the present invention. As shown in FIG. 4, during the procedure of combining the cover structure 10 of the present invention with the electronic apparatus 20, each of the second fixed portions 164 of the second handle 16 on the cover structure 10 is aligned with each of the second corresponding fixing portions 212 of the casing 21 on the electronic apparatus 20, and then the cover structure 10 is obliquely jointed on the electronic apparatus 20. Next, the joint functions as a pivot, and the cover structure 10 is rotated toward the position where the casing 21 is located; at this time, the user can apply an external force to make the first handle 13 move relative to the bezel 11 so as to facilitate the cover structure 10 being rotated to the position on the bezel 11 that is substantially parallel to the front side 215 of the casing 21. When the user does not apply the external force on the first handle 13, the first handle 13 will be returned to the original position by the elastic force provided by the abovementioned at least one elastic member, and thus each of the first fixed portions 134 will engage correspondingly with each of the first corresponding fixing portions of the casing 21 (not shown in the figure; please refer to FIG. 3 and FIG. 5), so as to combine the cover structure 10 with the casing 21 of the electronic apparatus 20.

Figure 5:
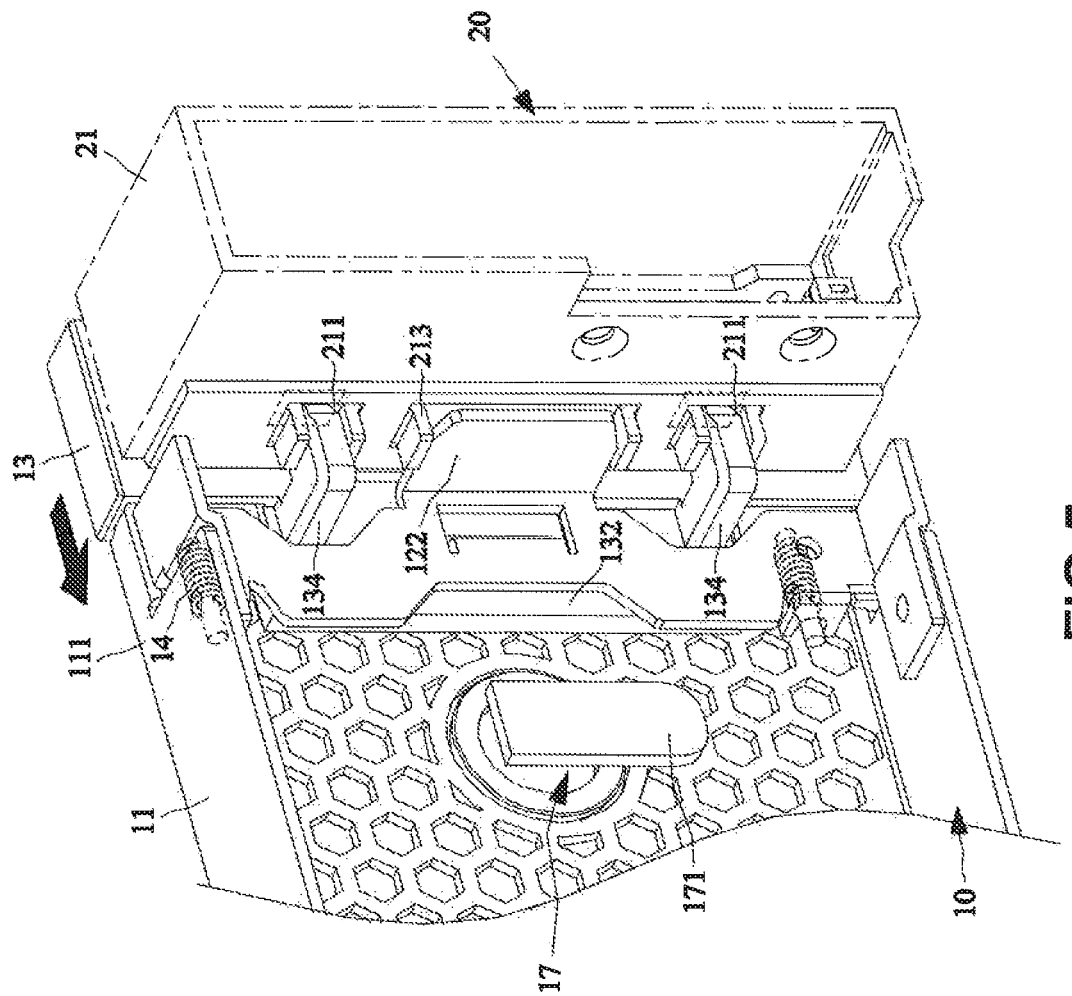
FIG. 5 is a schematic diagram of the locking module of the cover structure in a non-locked state in accordance with the present invention.
Figure 6:
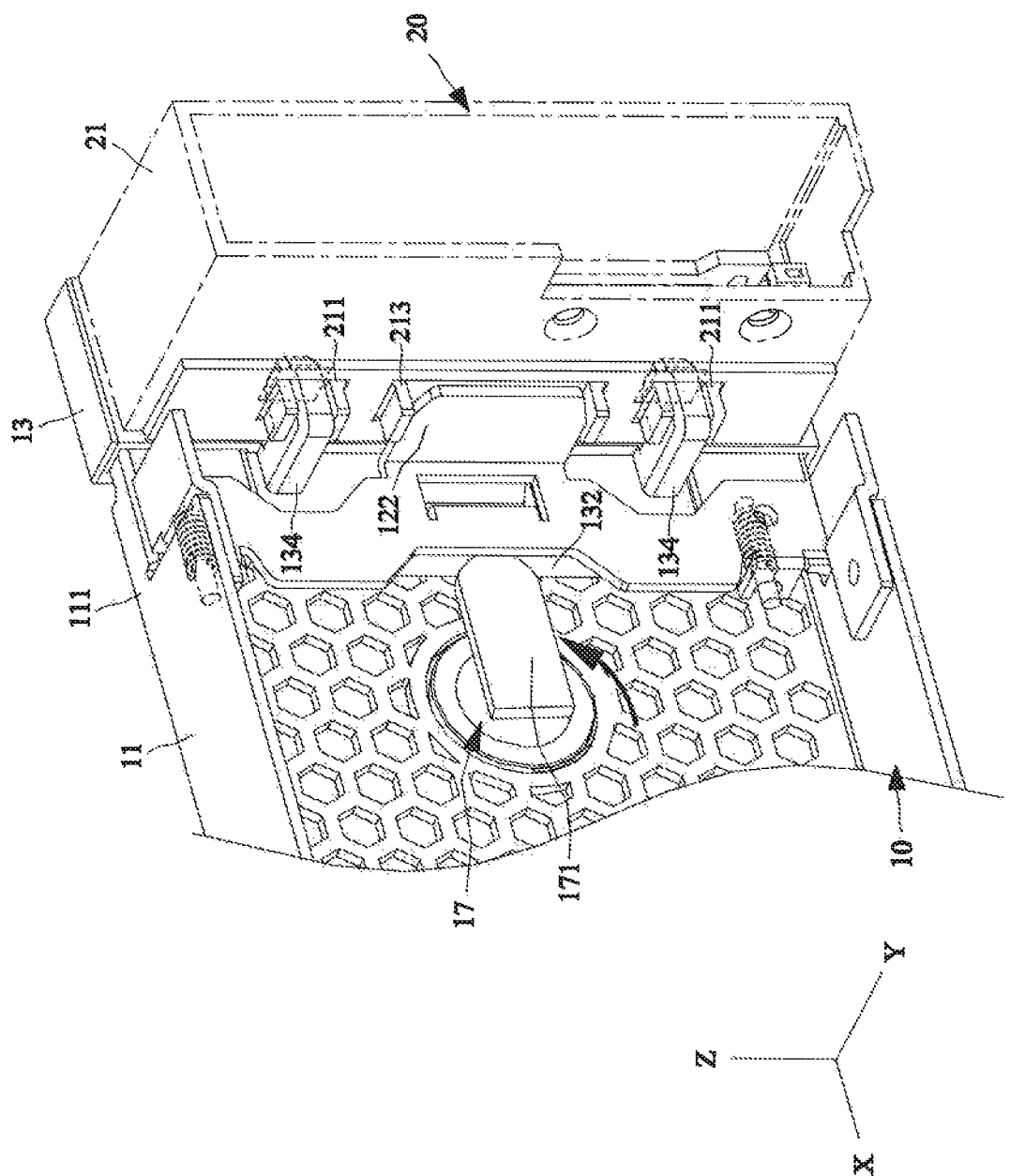
FIG. 6 is a schematic diagram of the locking module of the cover structure in a locked state in accordance with the present invention.

Please refer to FIG. 5 and FIG. 6 together. FIG. 5 is a schematic diagram of the locking module of the cover structure in a non-locked state in accordance with the present invention; FIG. 6 is a schematic diagram of the locking module of the cover structure in a locked state in accordance with the present invention. As shown in FIG. 5, when the cover structure 10 is combined with the casing 21 of the electronic apparatus 20, each of the first fixed portions 134 of the first handle 13 will be engaged correspondingly with each of the first corresponding fixing portions 211 of the casing 21, and thus the fixing effect along the y-axis direction and z-axis direction shown in the figure can be achieved; and by the first position-limiting portion 122 cooperating with the first corresponding position-limiting portion 213, the cover structure 10 can be assisted in moving along the z-axis direction (i.e., substantially parallel to the axis direction of the first lateral side 111 of the bezel 11), and further make the cover structure 10 stable and unlikely to fall off easily. Similarly, the second handle 16 combined with the second lateral side 112 (please refer to FIG. 3 and FIG. 4) can use an analogous method to provide the same fixing effect with the casing 21. At this time, the front side of the casing 21 can be protected by the cover structure 10 of the present invention and will not easily be touched inadvertently.

When the locking module 17 is not in the locked state, the first handle 13 can move relative to the bezel 11 along the direction substantially parallel to the long side 110 of the bezel 11; i.e., along the x-axis as shown in the figure. When force is applied to the first handle 13 and the first handle 13 is moved along the direction of the arrow shown in the figure, each of the first fixed portions 134 of the first handle 13 will thus be moved such that each of the first fixed portions 134 will leave the engaging state with each of the first corresponding fixing portions 211 of the casing 21 gradually, and each of the elastic members 14 will be pressed. When each of the first fixed portions 134 of the first handle 13 leaves the first corresponding fixing portion 211 completely, the user can, as illustrated in FIG. 3, operate reversely the cover structure 10 of the present invention (i.e., use the second handle 16 as the pivot and rotate the first handle 13 toward the direction away from the casing 21, and pull out the cover structure 10), so as to detach the cover structure 10 from the casing 21. Without the application of force, the first handle 13 will be returned to its original position by the elastic recovery force provided by each of the elastic members 14.

As shown in FIG. 6, when the locking member 171 of the locking module 17 is rotated to change the locking module 17 to the locked state, the first extension portion 132 of the first handle 13 will be against the locking member 171, and thus the first handle 13 will be limited and unable to move relative to the bezel 11 along the y-axis. That is to say, when the locking module 17 is kept in the locked state, each of the first fixed portions 134 of the first handle 13 cannot leave the engaging state with each of the first corresponding fixing portions 211 of the casing 21, and thus the cover structure 10 can be fixed along the x-axis, the y-axis, and the z-axis. Therefore, the safety of using the cover structure 10 can be increased by the locking module 17, and unless the locking module 17 is unlocked from the locked state, the cover structure 10 cannot easily be detached from the casing 21.

In summary, regardless of the function, the way and result of the present invention are shown to have technical characteristics unlike those of the prior arts. However, the aforementioned embodiments are only for illustrating the principle and the result of the present invention and should not be construed to limit the range of the present invention. It will be obvious to those skilled in the art that, based upon the descriptions herein, changes and modifications may be made without departing from this invention and its broader aspects. Therefore, the appended claims are intended to encompass within their scope of all such changes and modifications as are within the true spirit and scope of the exemplary embodiment of the present invention.

What is claimed is:

1. A cover structure, adapted to an electronic apparatus, the cover structure comprising:
    a bezel comprising two long sides, a first lateral side and a second lateral side;
    a first bracket fixed on the first lateral side, the first bracket comprising a first protruding portion; and
    a first handle moveably combined with the first lateral side, the first handle being able to move parallel substantially to each long side of the bezel, the first handle comprising a first recess and at least one first fixed portion, the first protruding portion of the first bracket being disposed in the first recess, and the at least one first fixed portion being configured for connecting a casing of the electronic apparatus;
    a locking module, being disposed on the bezel and adjacent to the first lateral side and between the first handle and the second lateral side, the locking module comprising a locking member, and the locking member is rotatable to form a locked state or an unlocked state, wherein when the locking member is in the locked state, the locking member contacts the first handle so as to stop the first handle from moving along the direction substantially parallel to each of the long sides and toward the second lateral side, and when the locking member is in the unlocked state, the locking member does not contact the first handle, such that the first handle moves along the direction substantially parallel to each of the long sides and toward the second lateral side.

2. The cover structure as claimed in claim 1, wherein the first handle further comprises a first extension portion, and in the locked state, the locking module is held against the first extension portion by the locking member so as to stop the first handle from moving relative to the bezel.

3. The cover structure as claimed in claim 1 further comprising:
    a second bracket, fixed on the second lateral side, the second bracket comprising a second protruding portion substantially perpendicular to the bezel; and
    a second handle, combined with the second lateral side, the second handle comprising a second recess and at least one second fixed portion; the second protruding portion of the second bracket being disposed in the second recess, and the at least one second fixed portion being configured for connecting the electronic apparatus.

4. The cover structure as claimed in claim 3, wherein the first bracket, the second bracket and the bezel form an integrated structure.

5. The cover structure as claimed in claim 3, wherein the second lateral side comprises a resistance portion, and the second handle further comprises a second extension portion; the resistance portion is against the second extension portion of the second handle so as to stop the second handle moving relative to the bezel.

6. The cover structure as claimed in claim 1, wherein the first bracket further comprises a first position-limiting portion, the first position-limiting portion being substantially perpendicular to the bezel and extending toward the reverse direction of the first protruding portion.

7. The cover structure as claimed in claim 3, wherein the second bracket further comprises a second position-limiting portion, the second position-limiting portion being substantially perpendicular to the bezel and extending toward the reverse direction of the second protruding portion.

8. The cover structure as claimed in claim 1, wherein two first guiding portions of the bezel are formed at the first end, and the first handle further comprises two first corresponding guiding portions, each of the first guiding portions and first corresponding guiding portions being operated in coordination to assist the first handle in moving substantially parallel to each of the long sides of the bezel.

9. The cover structure as claimed in claim 1, wherein the first bracket further comprises at least one first stopping portion, each of the first stopping portions being substantially perpendicular to the bezel and extending toward the bezel; wherein the cover structure further comprises at least one elastic member, each of the elastic members comprising a first end and a second end, the first end being against the first handle and the second end is against the first stopping portion.

10. An electronic apparatus, comprising:
    a casing, comprising at least one first corresponding fixing portion; and a cover structure, removable and combined with the casing, the cover structure comprising:
a bezel, comprising two long sides, a first lateral side and a second lateral side;
a first bracket, fixed on the first lateral side, the first bracket comprising a first protruding portion; and
a first handle, moveably combined with the first lateral side, the first handle being able to substantially move parallel to each of the long sides of the bezel; the first handle comprising a first recess and at least one first fixed portion, the first protruding portion of the first bracket being disposed in the first recess, and the at least one first fixed portion being configured for connecting a casing of the electronic apparatus;
a locking module, being disposed on the bezel and adjacent to the first lateral side and between the first handle and the second lateral side, the locking module comprising a locking member, and the locking member is rotatable to form a locked state or an unlocked state, wherein when the locking member is in the locked state, the locking member contacts the first handle so as to stop the first handle from moving along the direction substantially parallel to each of the long sides and toward the second lateral side, and when the locking member is in the unlocked state, the locking member does not contact the first handle, such that the first handle moves along the direction substantially parallel to each of the long sides and toward the second lateral side.

11. The electronic apparatus as claimed in claim 10, wherein the first handle further comprises a first extension portion, and in the locked state the locking module is held against the first extension portion by the locking member so as to stop the first handle moving relative to the bezel.

12. The electronic apparatus as claimed in claim 10, wherein the casing further comprises at least one second corresponding fixing portion, and the cover structure further comprising:
a second bracket, fixed on the second lateral side, the second bracket comprising a second protruding portion substantially perpendicular to the bezel; and
a second handle, combined with the second lateral side, the second handle comprising a second recess and at least one second fixed portion, the second protruding portion of the second bracket being disposed in the second recess, and each of the second fixed portions corresponding to each of the second corresponding fixing portions.

13. The electronic apparatus as claimed in claim 12, wherein the first bracket, the second bracket, and the bezel form an integrated structure.

14. The electronic apparatus as claimed in claim 12, wherein the second lateral side comprises a resistance portion, and the second handle further comprises a second extension portion, the resistance portion being against the second extension portion of the second handle so as to stop the second handle moving relative to the bezel.

15. The electronic apparatus as claimed in claim 10, wherein the first bracket further comprises a first position-limiting portion, the first position-limiting portion being substantially perpendicular to the bezel and extending toward the reverse direction of the first protruding portion; the casing further comprises a first position-limiting portion, so as to provide a position-limiting function along an axis direction substantially parallel to the first lateral side by the first position-limiting portion cooperating with the first corresponding position-limiting portion when the cover structure is combined with the casing.

16. The electronic apparatus as claimed in claim 12, wherein the second bracket further comprises a second position-limiting portion, the second position-limiting portion being substantially perpendicular to the bezel and extending toward the reverse direction of the second protruding portion; the casing further comprises a second position-limiting portion so as to provide a position-limiting function along an axis direction substantially parallel to the second lateral side by the second position-limiting portion cooperating with the second corresponding position-limiting portion when the cover structure is combined with the casing.

17. The electronic apparatus as claimed in claim 10, wherein two first guiding portions of the bezel are formed at the first end, and the first handle further comprises two first corresponding guiding portions, each of the first guiding portions and first corresponding guiding portions being operated in coordination to assist the first handle in moving substantially parallel to each of the long sides of the bezel.

18. The electronic apparatus as claimed in claim 15, wherein the first bracket further comprises at least one first stopping portion, each of the first stopping portions being substantially perpendicular to the bezel and extending toward the bezel; and the cover structure further comprises at least one elastic member, each of the elastic members comprises a first end and a second end, the first end being against the first handle and the second end being against the first stopping portion.

* * * * *